US009997491B2

(12) United States Patent
Ichimura

(10) Patent No.: US 9,997,491 B2
(45) Date of Patent: Jun. 12, 2018

(54) METHOD OF DETERMINING CURING CONDITIONS, METHOD OF PRODUCING CIRCUIT DEVICE, AND CIRCUIT DEVICE

(71) Applicant: Sony Corporation, Tokyo (JP)

(72) Inventor: Takeshi Ichimura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 668 days.

(21) Appl. No.: 14/406,958

(22) PCT Filed: Apr. 16, 2014

(86) PCT No.: PCT/JP2014/002163
§ 371 (c)(1),
(2) Date: Dec. 10, 2014

(87) PCT Pub. No.: WO2015/004830
PCT Pub. Date: Jan. 15, 2015

(65) Prior Publication Data
US 2016/0148899 A1 May 26, 2016

(30) Foreign Application Priority Data
Jul. 8, 2013 (JP) ................................ 2013-142400

(51) Int. Cl.
*H05K 3/30* (2006.01)
*H01L 23/00* (2006.01)
(Continued)

(52) U.S. Cl.
CPC ............ *H01L 24/81* (2013.01); *H01L 21/563* (2013.01); *H01L 21/565* (2013.01);
(Continued)

(58) Field of Classification Search
CPC ..... H01L 21/563; H01L 21/565; H01L 21/56; H01L 24/81; H01L 24/83; H01L 24/16;
(Continued)

(56) References Cited

U.S. PATENT DOCUMENTS 5,232,532 A * 8/1993 Hori ..................... H01L 21/563 156/163
5,804,882 A * 9/1998 Tsukagoshi ....... H01L 23/49838 257/690
(Continued)

FOREIGN PATENT DOCUMENTS

JP 06-088795 3/1994
JP 2001-068508 3/2001
(Continued)

OTHER PUBLICATIONS

PCT International Search Report issued in connection with related PCT/JP2014/002163 dated Jun. 24, 2014.

*Primary Examiner* — Peter DungBa Vo
*Assistant Examiner* — Kaying Kue
(74) *Attorney, Agent, or Firm* — Dentons US LLP

(57) ABSTRACT

A method of determining curing conditions is for determining the curing conditions of a thermosetting resin to seal a conductive part between a substrate and an electronic component. A curing degree curve is created. The curing degree curve indicates, with respect to each of heating temperatures, relationship between heating time and curing degree of the thermosetting resin. On the basis of the created curing degree curve, a void removal time of a void naturally moving upward in the thermosetting resin, at a first heating temperature, is calculated. The first heating temperature is one of the heating temperatures.

9 Claims, 7 Drawing Sheets

(51) Int. Cl.

| | |
|---|---|
| ***H05K 3/34*** | (2006.01) |
| ***H05K 3/36*** | (2006.01) |
| ***H01L 21/56*** | (2006.01) |
| ***H01L 23/29*** | (2006.01) |
| ***H01L 23/31*** | (2006.01) |
| ***H05K 1/14*** | (2006.01) |

(52) U.S. Cl.

CPC ........ *H01L 23/293* (2013.01); *H01L 23/3142* (2013.01); *H01L 24/16* (2013.01); *H01L 24/83* (2013.01); *H05K 1/144* (2013.01); *H05K 3/305* (2013.01); *H05K 3/3436* (2013.01); *H05K 3/363* (2013.01); *H01L 24/13* (2013.01); *H01L 24/29* (2013.01); *H01L 24/91* (2013.01); *H01L 2224/131* (2013.01); *H01L 2224/16238* (2013.01); *H01L 2224/2919* (2013.01); *H01L 2224/32225* (2013.01); *H01L 2224/73204* (2013.01); *H01L 2224/81193* (2013.01); *H01L 2224/81203* (2013.01); *H01L 2224/83192* (2013.01); *H01L 2224/83203* (2013.01); *H01L 2224/83862* (2013.01); *H01L 2224/9211* (2013.01); *H01L 2924/0665* (2013.01); *H01L 2924/20104* (2013.01); *H01L 2924/20105* (2013.01); *H01L 2924/20106* (2013.01); *H01L 2924/20107* (2013.01); *H05K 2201/041* (2013.01); *H05K 2201/10977* (2013.01); *H05K 2203/0278* (2013.01); *H05K 2203/1105* (2013.01); *H05K 2203/1305* (2013.01); *Y02P 70/613* (2015.11)

(58) Field of Classification Search

CPC ......... H01L 24/13; H01L 24/29; H01L 24/91; H01L 23/293; H01L 23/3142; H01L 2224/9211; H01L 2224/81; H01L 2224/83; H05K 3/341–3/3442; H05K 3/3489; H05K 3/303; H05K 3/305; H05K 3/3436; H05K 3/363; Y10T 29/49146; Y10T 29/4913; B32B 37/0007; B32B 37/003; B29C 66/342; B29C 66/94–66/9492

USPC ....... 29/832–837, 841; 174/174; 156/64, 87, 156/60, 295, 325–338

See application file for complete search history.

(56) References Cited

U.S. PATENT DOCUMENTS

| | | | | | |
|---|---|---|---|---|---|
| 5,892,289 | A * | 4/1999 | Tokuno | H01L 21/563 | 257/778 |
| 5,926,694 | A * | 7/1999 | Chigawa | H01L 21/563 | 257/E21.503 |
| 5,994,165 | A * | 11/1999 | Yoshino | H01L 21/563 | 257/E21.503 |
| 6,121,553 | A * | 9/2000 | Shinada | H01L 23/49894 | 174/255 |
| 6,387,733 | B1 * | 5/2002 | Holyoak | H01L 24/29 | 257/684 |
| 6,518,095 | B1 * | 2/2003 | Akutsu | H01L 24/83 | 257/E21.505 |
| 6,524,690 | B1 * | 2/2003 | Dyksterhouse | B29B 15/122 | 428/221 |
| 6,677,184 | B2 * | 1/2004 | Kohashi | H01S 5/0226 | 438/118 |
| 6,841,415 | B2 * | 1/2005 | Suzuki | H01L 21/563 | 257/E21.503 |
| 6,841,420 | B2 * | 1/2005 | Ohuchi | H01L 24/83 | 438/112 |
| 7,159,309 | B2 * | 1/2007 | Yamamoto | H05K 3/305 | 156/356 |
| 7,341,642 | B2 * | 3/2008 | Kumakura | H01L 21/563 | 156/273.5 |
| 7,807,014 | B2 * | 10/2010 | Yamaguchi | C08G 73/1003 | 156/307.1 |
| 7,935,892 | B2 * | 5/2011 | Nishikawa | C09J 9/02 | 174/255 |
| RE43,404 | E * | 5/2012 | DiStefano | H01L 21/561 | 438/106 |
| 8,257,528 | B2 * | 9/2012 | Yagihashi | H01L 21/2007 | 156/325 |
| 8,389,328 | B2 * | 3/2013 | Meura | B23K 1/0016 | 257/E21.006 |
| 8,623,512 | B2 * | 1/2014 | Pyun | C08G 59/621 | 156/330 |
| 9,209,155 | B2 * | 12/2015 | Wakioka | C09J 163/00 | |
| 2001/0016372 | A1 * | 8/2001 | Murakami | H01L 21/563 | 438/113 |
| 2002/0168504 | A1 * | 11/2002 | Yamaji | B29B 15/122 | 428/209 |
| 2003/0019562 | A1 * | 1/2003 | Warn | C09J 5/06 | 156/87 |
| 2004/0079464 | A1 * | 4/2004 | Kumakura | H01L 21/563 | 156/60 |
| 2006/0028611 | A1 * | 2/2006 | Yu | B32B 37/003 | 349/189 |
| 2009/0029100 | A1 * | 1/2009 | Wigdorski | B29C 66/342 | 428/98 |
| 2009/0302462 | A1 * | 12/2009 | Hosomi | B32B 5/26 | 257/734 |
| 2011/0075248 | A1 * | 3/2011 | LeCain | G02F 1/167 | 359/296 |
| 2011/0221075 | A1 * | 9/2011 | Meura | B23K 1/0016 | 257/779 |
| 2013/0112233 | A1 * | 5/2013 | Coakley | H05K 1/02 | 136/244 |
| 2013/0312907 | A1 * | 11/2013 | Oh | B32B 38/1858 | 156/285 |
| 2014/0241790 | A1 * | 8/2014 | Woleader | F16B 11/006 | 403/270 |
| 2014/0261970 | A1 * | 9/2014 | Moors | B29C 70/021 | 156/87 |

FOREIGN PATENT DOCUMENTS

| | | |
|---|---|---|
| JP | 2008-069243 | 3/2008 |
| JP | 2008-069246 | 3/2008 |
| JP | 2011-103089 | 5/2011 |
| JP | 5048292 | 10/2012 |
| WO | WO/2011/158666 A1 | 12/2011 |

* cited by examiner

METHOD OF DETERMINING CURING CONDITIONS, METHOD OF PRODUCING CIRCUIT DEVICE, AND CIRCUIT DEVICE

TECHNICAL FIELD

The present disclosure relates to a method of determining curing conditions of a thermosetting resin to seal a conductive part between a substrate and an electronic component, a circuit device such as a circuit board with the electronic component being mounted thereon, and the method of producing it.

BACKGROUND ART

In a process of mounting electronic components of those such as integrated circuits and flexible printed circuit boards on a circuit board, generally, an epoxy-based thermosetting resin called an underfill material is used for sealing a gap between an electronic component and the circuit board.

The technique described in Patent Document 1 is about a method of determining a pattern of heating for heat curing processing of the thermosetting resin. This technique employs performing DSC (Differential scanning calorimetry) on the thermosetting resin, and finds the rate equation of the thermosetting reaction of the thermosetting resin. According to this, an appropriate pattern of heating would be determined. (For example, see paragraphs [0018] and [0019] of Patent Document 1.)

The technique described in Patent Document 2 is about a method of predicting the rate of curing of a thermosetting resin. This technique has improved the KJMA (Kolmogorov-Johnson-Mehl-Avrami) model in order to find the curing property of the thermosetting resin which is closer to reality. (For example, see paragraphs [0005] and [0010] of Patent Document 2.) However, the KJMA model basically describes a volume change in a chemical reaction; and it would not always be consistent with actual cases of epoxy resins that may exhibit a more complex reaction of volume expansion and contraction.

Patent Document 1: Japanese Patent Application Laid-open No. Hei 6-88795

Patent Document 2: Japanese Patent No. 5048292

DISCLOSURE OF THE INVENTION

Problem to be Solved by the Invention

Besides, during the heating of the thermosetting resin, a void would be produced in the thermosetting resin, and this void may remain inside the resin. Consequently, in cases where there are many voids left inside the resin, a problem that the quality of the resin as a sealing material would deteriorate may arise; for example, the resin might be peeled off more easily.

Accordingly, an object of the present disclosure is to provide a method of determining curing conditions, and a method of producing a circuit device, which methods enables to reduce residual voids in a thermosetting resin; and to provide a circuit device produced by the above-mentioned method of production.

Means for Solving the Problem

In order to solve the problems described above, according to the present disclosure, a method of determining curing conditions is for determining the curing conditions of a thermosetting resin to seal a conductive part between a substrate and an electronic component.

In the method, a curing degree curve is created. The curing degree curve indicates, with respect to each of heating temperatures, relationship between heating time and curing degree of the thermosetting resin.

On the basis of the created curing degree curve, a void removal time of a void naturally moving upward in the thermosetting resin, at a first heating temperature, is calculated. The first heating temperature is one of the heating temperatures.

A time based on the calculated void removal time would be determined as a heating time at the first heating temperature.

In the present disclosure, the void removal time is determined as a base of the heating time, at the first heating temperature which is a heating temperature for heating the thermosetting resin. It may thus make it possible to reduce the residual voids, and to form a high-quality sealing material.

In the calculating, the created curing degree curve may be converted to viscosity of the thermosetting resin.

The void removal time may be calculated based on an equation representing a state of the natural upward movement of the void, using as a parameter the viscosity obtained from the conversion. By converting the curing degree curve to viscosity, it becomes possible to know the kinetic state of the void; and this may enable to find the void removal time.

The equation representing the state of the natural upward movement of the void may further use as a parameter a diameter of the void. In the calculation of the void removal time, the void removal time may be calculated based on an equation representing relationship between the diameter of the void and a pressure being applied to the void. This may enable to find more accurate void removal time.

A method of producing a circuit device, according to the present disclosure, includes calculating, on the basis of a curing degree curve, a void removal time of a void naturally moving upward in a thermosetting resin at a first heating temperature which is one of heating temperatures. The curing degree curve indicates, with respect to each of the heating temperatures, relationship between heating time and curing degree of the thermosetting resin.

The thermosetting resin would be provided onto a substrate so as to cover a solder part provided on an electrode on the substrate.

An electronic component would be placed on the substrate in such a manner that an electrode of the electronic component or a solder part provided on this electrode confronts the solder part provided on the electrode on the substrate being provided with the thermosetting resin.

The thermosetting resin would be heated at the first temperature, until a time based on the void removal time obtained by the calculation elapses from starting heating.

Since this method of production includes calculating the void removal time of the void naturally moving upward, on the basis of the curing degree curve; and then heating the thermosetting resin until a certain time, which is a time based on the void removal time obtained by the calculation, elapses from starting heating; it thus may be able to reduce the residual voids, as greatly as possible.

The thermosetting resin may be an epoxy resin.

The first heating temperature may be 200° C. or higher and 250° C. or lower.

The method of producing the circuit device may further include heating the thermosetting resin at a second heating temperature, after the void removal time has elapsed from starting heating. The second heating temperature is lower than the first heating temperature. By heating the thermosetting resin at the relatively low second heating temperature after the void removal time has elapsed, under a state where the void has almost gone due to the heating at the first heating temperature; it makes it possible to enhance the quality of the thermosetting resin.

The second heating temperature may be 100° C. or higher and 150° C. or lower.

In the calculating, the created curing degree curve may be converted to viscosity of the thermosetting resin. The void removal time may be calculated based on an ascent rate or a position by the natural upward movement of the void, using as a parameter the viscosity obtained from the conversion. By converting the curing degree curve to viscosity, it becomes possible to know the kinetic state of the void; and this may enable to find the void removal time.

In the placing of the electronic component on the substrate, the electronic component may be brought into contact with the thermosetting resin on the substrate in a state where: an electrode arrangement surface of the electronic component on which the electrode is disposed, or a solder arrangement surface on which the solder part provided on the electrode is disposed, is angled with respect to a mounting surface of the substrate on which the electrode of the substrate is disposed. Further, after the contact, the electronic component may be pressed against the thermosetting resin, in such a manner that the angle between the mounting surface of the substrate and the electrode arrangement surface or the solder arrangement surface of the electronic component is lowered. In such a manner, the action of the placing of the electronic component can be effectively used to push out the void from the inside of the thermosetting resin.

The method of producing a circuit device may further include irradiating the thermosetting resin with ultrasonic waves during or after heating the thermosetting resin. Or, the method of production may further include subjecting the thermosetting resin to an alternating magnetic field during or after heating the thermosetting resin. This may allow the void to escape into the air in cases where the void has risen to the surface of the thermosetting resin. This may enable to ensure removal of the void.

Another method of producing a circuit device, according to the present disclosure, includes calculating, on the basis of a curing degree curve, a void removal time of a void naturally moving upward in a thermosetting resin at a first heating temperature which is one of heating temperatures. The curing degree curve indicates, with respect to each of the heating temperatures, relationship between heating time and curing degree of the thermosetting resin.

The thermosetting resin would be provided onto a substrate so as to cover an electrode on the substrate.

An electronic component would be placed on the substrate in such a manner that a solder part provided on an electrode of the electronic component confronts the electrode on the substrate being provided with the thermosetting resin.

The thermosetting resin would be heated at the first temperature, until a time based on the void removal time obtained by the calculation elapses from starting heating.

A circuit device according to the present disclosure is a circuit device that is obtained by each production method above.

Effects of the Invention

As described above, according to the present disclosure, it makes it possible to reduce the residual voids in the thermosetting resin.

MODE(S) FOR CARRYING OUT THE INVENTION

Hereinafter, some embodiments of the present disclosure will be described with reference to the drawings.

1. First Embodiment (1) Method of Producing a Circuit Device

Figure 1:
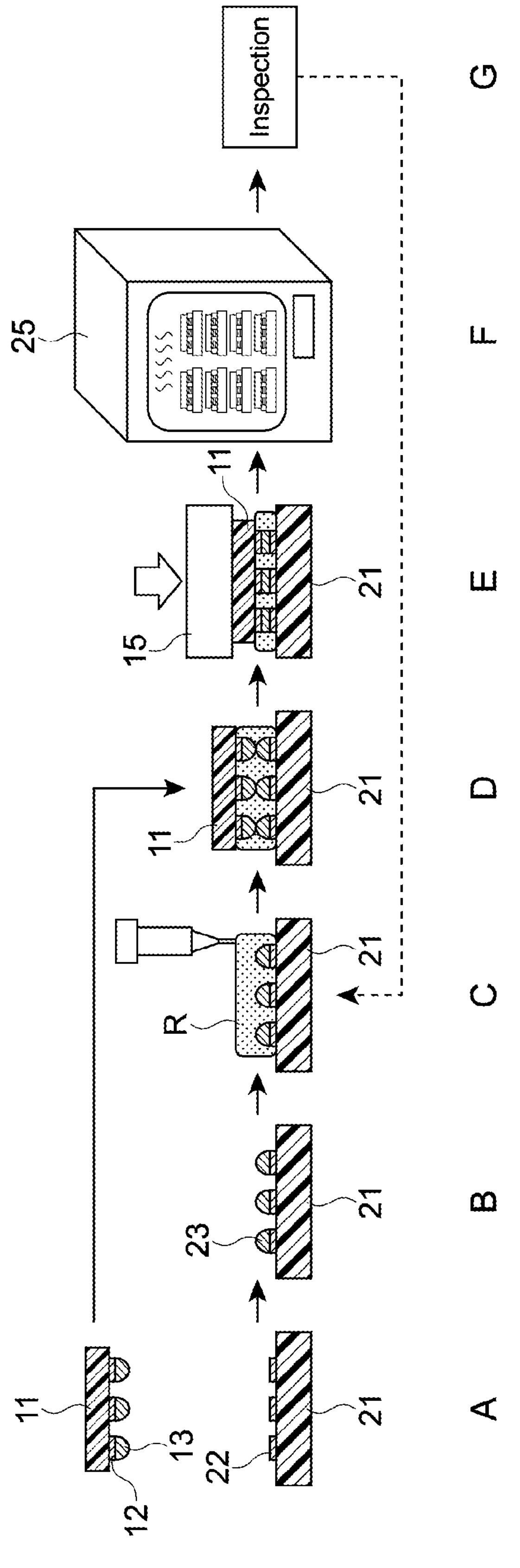
FIG. 1 schematically shows a part of a production process of circuit devices according to an embodiment of the present disclosure.
Figure 2:
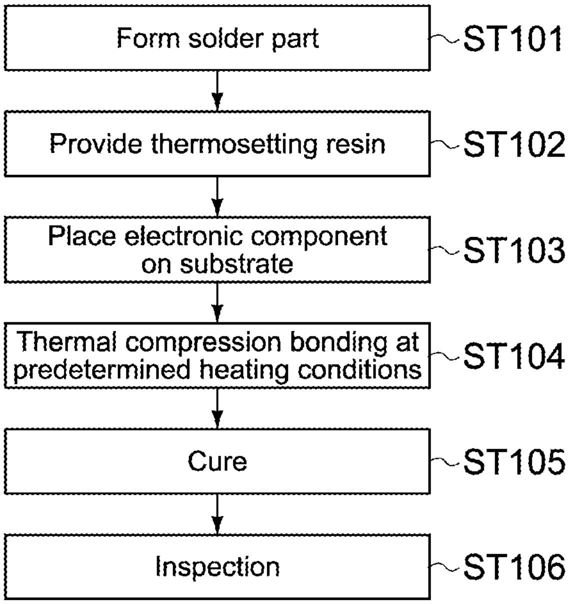
FIG. 2 is a flowchart showing the production process of FIG. 1.

FIG. 1 schematically shows a part of a production process of circuit devices according to an embodiment of the present disclosure. FIG. 2 is a flowchart showing the production process. In the following, the production process will be described in order referring to FIGS. 1 and 2.

As shown in FIG. 1A, an electronic component 11 and a mounting substrate 21 to mount the electronic component 11 are prepared. On the mounting substrate 21, electrodes 22 are provided. The electronic component 11 has some electrodes 12 and some solder parts (e.g., pre-coating solder bumps) 13 which are provided on the electrodes 12.

The mounting substrate 21 to have the components mounted thereon may typically be a rigid substrate, or it may be a flexible substrate. The electronic component 11 may be, for example, an integrated circuit (IC), or may be a flexible print circuit (FPC).

As shown in FIG. 1B, for example, a solder paste may be coated on the electrode 22 on the mounting substrate 21, to form a solder part (e.g., solder bump) 23 is formed (Step 101).

As shown in FIG. 1C, in such a manner that the solder part 23 on the mounting substrate 21 is covered, a thermosetting resin R which is an underfill material is provided onto the mounting substrate (Step 102). Mainly, an epoxy resin may be used as the thermosetting resin R.

As shown in FIG. 1D, in such a manner that the solder part 13 of the electronic component 11 confronts the solder part 23 of the mounting substrate 21 being provided with the thermosetting resin R, that is, by the flip-chip method, the electronic component 11 is placed on the thermosetting resin R on the mounting substrate 21 (Step 103).

As shown in FIG. 1E, the electronic component 11 and the mounting substrate 21, from the state shown in FIG. 1D, are bonded by thermal compression bonding under predetermined heating conditions (predetermined heating temperature and time) which will be described later (Step 104).

For example, a press-head 15 having a heater may press the electronic component 11, to heat up the thermosetting resin R at the predetermined temperature which will be described later, by an effect of heat conduction in the electronic component 11. As a result, the solder parts 13 and 23 are melted. Thus the electrodes 12 and 22 (see FIG. 1A) are bonded. The thermosetting resin R is cured, and thus the electrodes 12 and 22 are sealed.

Instead of the configuration in which the electronic component 11 side is heated, it may be a configuration in which the mounting substrate 21 (lower side of the mounting substrate 21) is heated. Alternatively, it may be a configuration in which the both sides, from the electronic component 11 side and the mounting substrate 21 side, may be heated.

After that, as shown in FIG. 1F, cure processing is performed by a curing oven 25 (Step 105). After the cure processing, as shown in FIG. 1G, for example, an inspection is performed, in which the inspection includes a process of checking whether or not the thermosetting resin R has any crack or void being generated (Step 106).

(2) Heating Conditions of Thermosetting Resin

Next, the heating conditions of the above-described thermosetting resin R, that is, a heating temperature and a heating time will be described. In this embodiment, a case in which, for example, an epoxy resin is used as the thermosetting resin R will be described. In the following, the thermosetting resin will be simply referred to as "resin", and will be referred to as "thermosetting resin" when the need arises.

Figure 3:
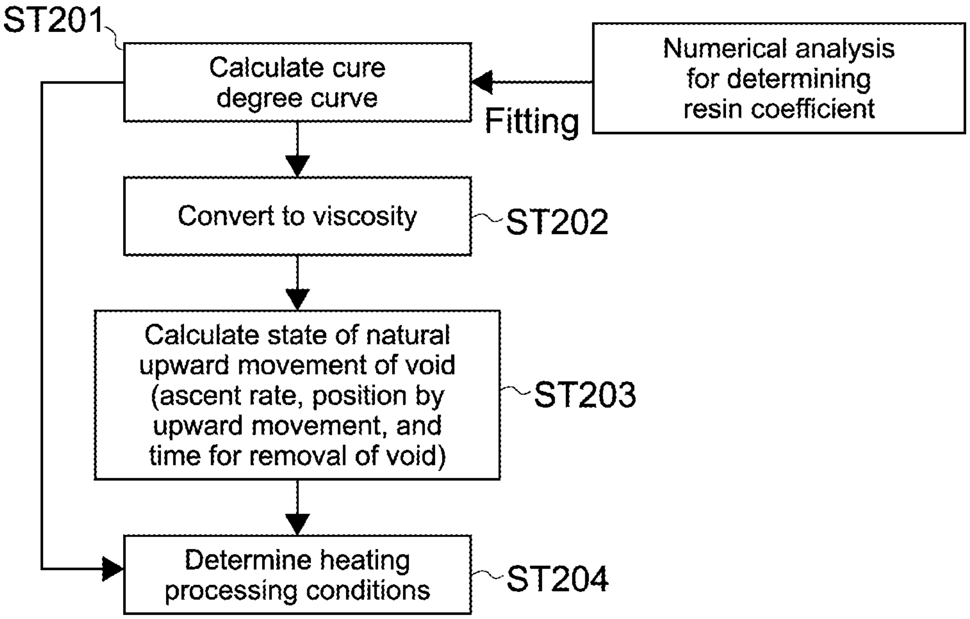
FIG. 3 is a flowchart showing the processing of a creation process for the heating conditions.

FIG. 3 is a flowchart showing the processing of a creation process for the heating conditions. In this processing, basically, a curing degree curve indicating relationship between heating time and curing degree of the thermosetting resin, with respect to each of heating temperatures, is calculated. Further, in this processing, on the basis of the created curing degree curve, a void removal time of a void naturally moving upward in the thermosetting resin at a first heating temperature which is one of the heating temperatures is calculated. This void removal time would be a base of the heating time. The "void" may be the water vapor with a diameter of 50 to 100 μm which is produced in the surface of the solder part 13 due to the heating of the resin and the like.

A computer may automatically calculate the steps 201 to 204 on the basis of a predetermined program; and also, a person may calculate at least one of the steps 201 to 204. Alternatively, in order to cause a computer to execute at least one of the calculations of the respective steps, a manual work may mediate in the middle of this processing.

(a) Calculation of Curing Degree Curve (Step 201)

In order to obtain the curing degree curve, the following Kamal's equation (modified Kamal's equation) as Equation 1 and Arrhenius equation as Equations 2 are used; and thus the time change in a curing degree α, that is, a curing rate (or curing degree curve) dα/dt is calculated.

[Formula 1]

$$\frac{d\alpha}{dt} = (k_1 + k_2\alpha^m)(1-\alpha)^n f_1(\alpha) \qquad \text{Equation 1}$$
$$f_1(\alpha) = C1^{C2\alpha}$$

α: curing degree,
m, n, C1, C2, A, E: resin coefficient

[Formula 2]

$$\left.\begin{aligned} k_1 &= A_1 \cdot \exp(-E_1/T) \\ k_2 &= A_2 \cdot \exp(-E_2/T) \end{aligned}\right\} \qquad \text{Equations 2}$$
$$T = f_2(t)$$

T: temperature of resin, heating temperature (function of time, $T=f_2(t)$),
t: heating time,
k ($k_1$, $k_2$): reaction speed constant,
A ($A_1$, $A_2$): frequency factor,
E ($E_1$, $E_2$): activation energy In reality, the curing rate changes with the curing degree, so Kamal's equation that is commonly used may not be accurate enough. In view of this, using a function of the curing degree α, the function being represented as $f_1(\alpha)$, the commonly-used Kamal's equation is multiplied by $f_1(\alpha)$, and the obtained equation is used as a "modified Kamal's equation". In the modified Kamal's equation and Arrhenius equation, each of m, n, C1, C2, A and E is a resin coefficient (resin constant) that is provided for each type of thermosetting resins.

Since it is difficult to find these resin coefficients as a general solution, the resin coefficients may be found by discretization by numerical analysis (e.g., difference method). Specifically, these resin coefficients may be found by performing a known differential scanning calorimetry (DSC), integrating the obtained DSC data (DSC curve) to obtain an actual curing degree curve (a curve representing the curing rate), and performing curve fitting.

To explain it more concretely, FIG. 4A shows an example of the above-mentioned DSC data. In this case, each DSC curve is shown for each type of thermosetting resin materials. The abscissa indicates the heating time to heat the resin and the ordinate indicates the heat flow. For example, each of upward and downward peak values of the curves indicates that a phase transition is taking place.

Upon obtaining the DSC data, the data are integrated to give curves indicating time change in the curing degree of the resins as shown in FIG. 4B (DSC integral curves). That is, the abscissa indicates time (heating time) and the ordinate indicates the curing degree. The DSC integral curves thus obtained would represent the time change of the actual curing degree, and these would be reference curves.

Then, as shown in FIG. 4C, discretization is performed by difference method, so that the curing degree curves obtained by the above-mentioned modified Kamal's equation are subjected to fitting to the above-mentioned reference curves. FIG. 4C focuses on a curing degree curve of one resin (epoxy resin, in this case) which is indicated in a solid-line curve, out of FIG. 4B. By performing such curve-fitting, each of the resin coefficients m, n, C1, C2, A and E would be determined.

On the basis of the curing degree curve according to the modified Kamal's equation (see Equation 1) including the resin coefficient thus being determined, it is possible to grasp the curing degree at any temperature and time.

Figure 4:
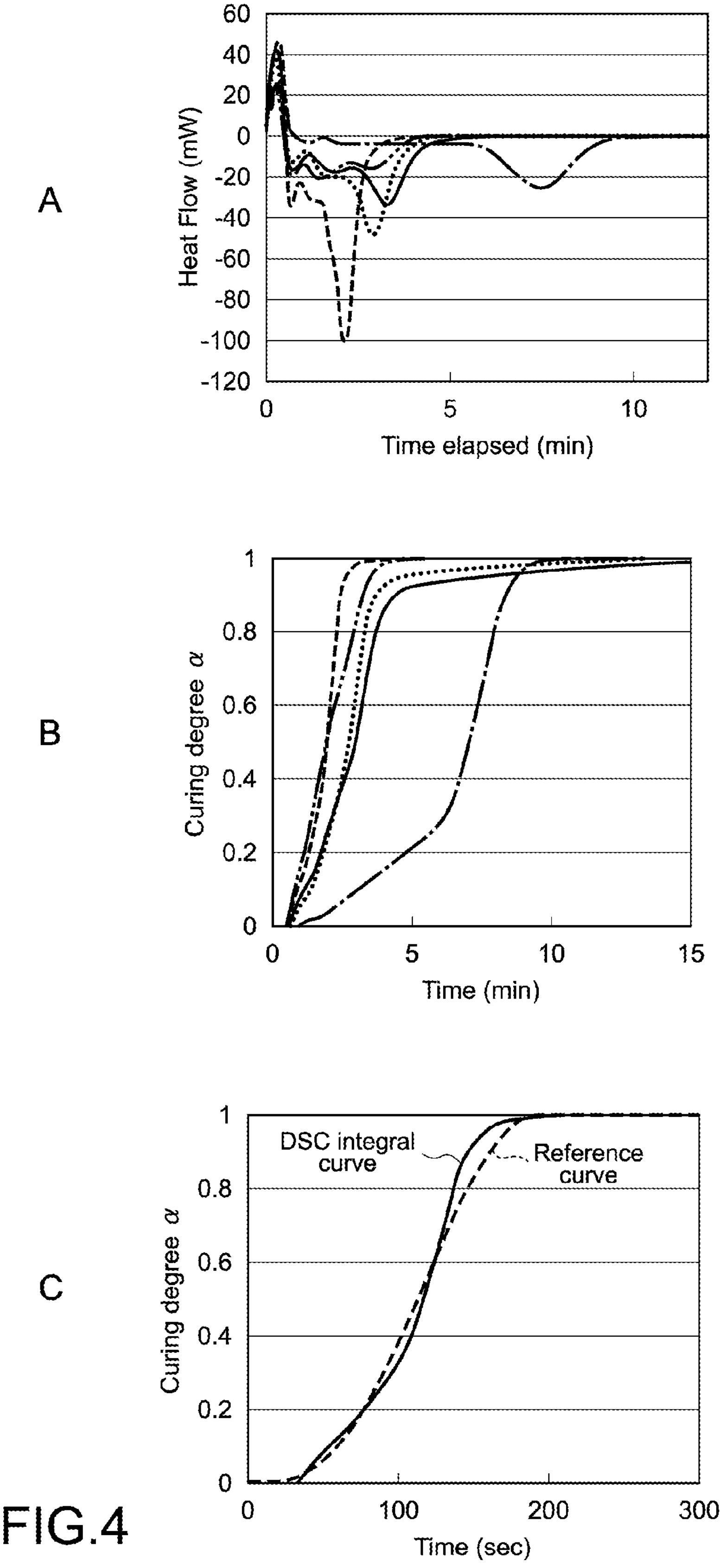
FIGS. 4A to 4C show an example of a method of a numerical analysis to find a resin coefficient of a modified Kamal's equation.
Figure 5:
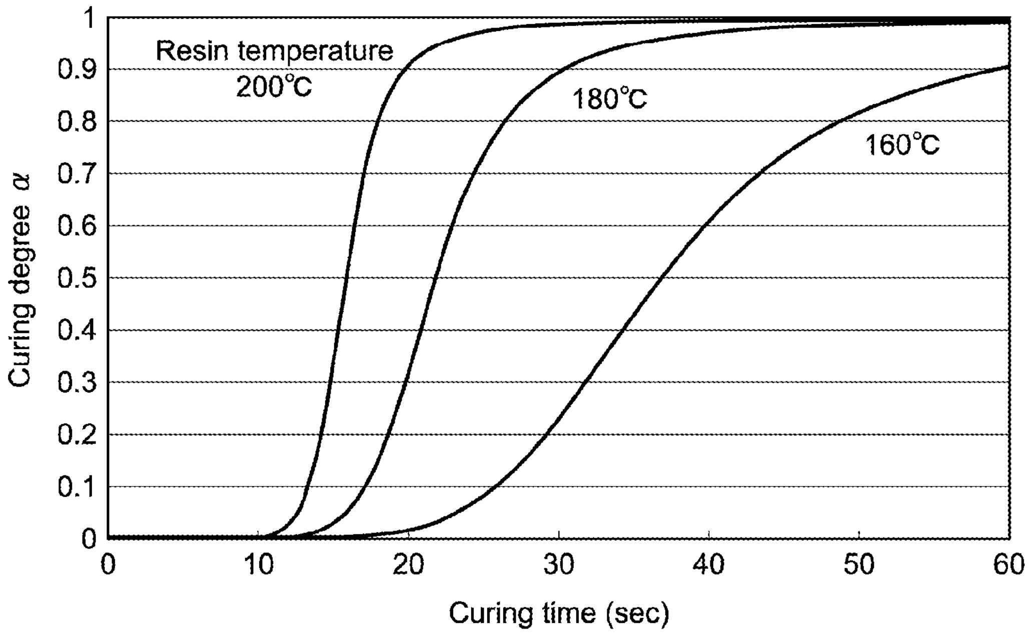
FIG. 5 is a graph showing curing degree curves of an epoxy resin based on the modified Kamal's equation obtained from the numerical analysis, shown with respect to each resin temperature.

FIG. 5 is a graph showing a curing degree curve of one resin (e.g., epoxy resin), based on the thus-obtained modified Kamal's equation, for each resin temperature. The resin temperatures of 200° C., 180° C. and 160° C. from the left part of FIG. 4 are shown. When the curing degree α is 1, the resin is in a completely cured state.

Regarding these curing degree curves, each resin temperature is not constant; and is provided with the condition in which the resin temperature rises with time ($T=f_2(t)$).

(b) Calculation of Viscosity of Thermosetting Resin (Step 202)

Next, the curing degree α obtained by the above-mentioned modified Kamal's equation (Equation 1) is converted into a viscosity $\mu_\alpha$. An equation for the conversion is expressed in the Equation 3 below. This equation for the conversion is "Macosko equation" which is commonly used.

[Formula 3]

$$\mu_\alpha = \mu_0 \left( \frac{1 + \frac{\alpha}{\alpha_{gel}}}{1 - \frac{\alpha}{\alpha_{gel}}} \right)^S \quad \text{Equation 3}$$

$$S = \frac{f}{T} - g_a$$

$\mu_0$: initial viscosity of resin $\mu_\alpha$: viscosity of resin when curing degree is α

Figure 6:
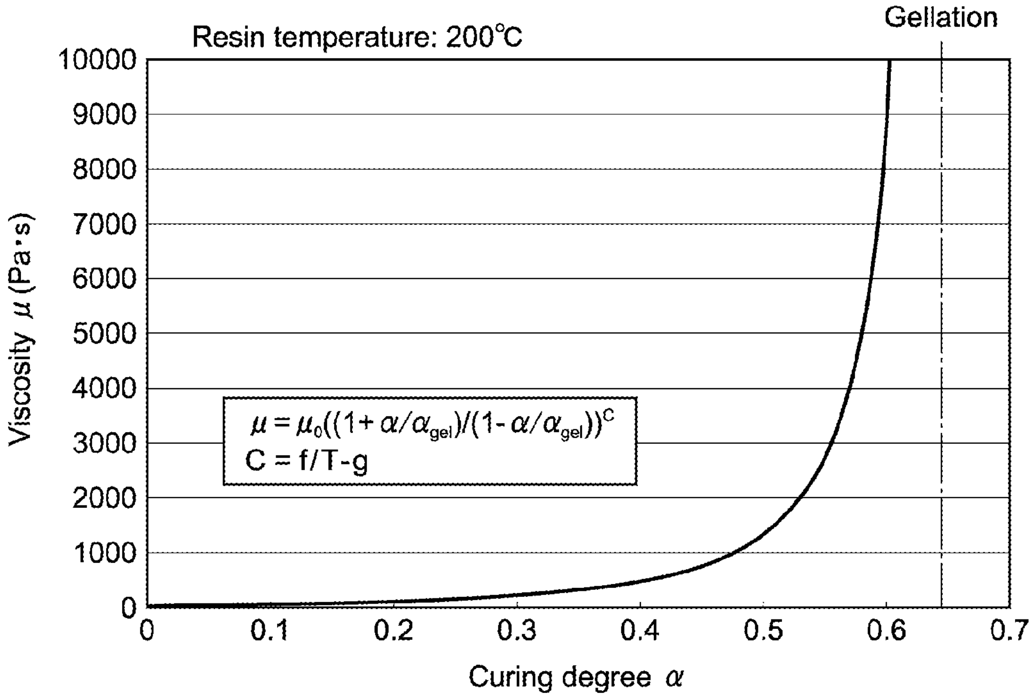
FIG. 6 is a graph showing relationship between a curing degree $\alpha$ and a viscosity $\mu$ based on Equation 3.

$\alpha_{gel}$: curing degree of resin when gelled f, $g_a$: viscosity's rising constant T: resin temperature FIG. 6 is a graph showing relationship between the curing degree α and the viscosity μ based on Equation 3. The resin temperature in this case is 200° C.

(c) Calculation of State of Natural Upward Movement of Void (Step 203)

Then, from the following motion equation (Equation 4), using the above-mentioned viscosity $\mu_\alpha$ as a parameter, a state of natural upward movement of a void, or in other words, an ascent rate or a position by the natural upward movement of the void, is calculated; thereby calculating a removal time for removal of the void.

Here, the shape of the void is approximated to a sphere. The position by the upward movement of the void, when described in another way, is a position inside the resin indicated by a height component (vertical component) from the surface of the solder part 23.

[Formula 4]

$$m_{VOID}\frac{dv}{dt} = (m_{RESIN}g - m_{VOID}g) - 6\pi r \mu_\alpha v \quad \text{Equation 4}$$

m: mass of void v: ascent rate g: acceleration of gravity r: radius of void

ρ: density of void

The ascent rate in the natural upward movement of the void may be calculated by: an amount of natural upward movement due to the void's buoyancy in the resin; an amount of upward movement due to an increase in the radius of the void with the rise in the temperature; and an amount of decrease due to an increase in drag forces.

Figure 7:
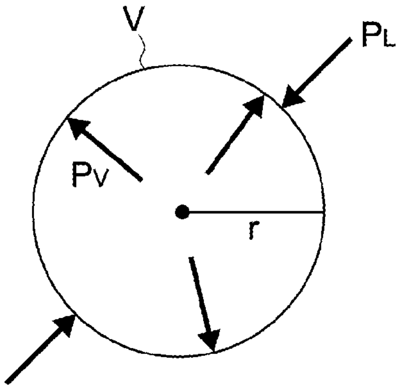
FIG. 7 is a figure for explaining the pressure difference exerted on a void, on the basis of Young-Laplace Equation 5.

Now, on the basis of the following Young-Laplace equation (Equation 5), the radius r of the void V (see FIG. 7) can be expressed as a function of $P_v$-$P_L$ (=ΔP). In other words, the radius of the void depending on the rise in the temperature of the inside of the resin would be proportional to surface tension; and inversely proportional to a pressure difference between the inside and the outside of the void.

$$P_v=P_L+2\sigma/r(\rightarrow r=2\sigma/\Delta P)$$

Figure 8:
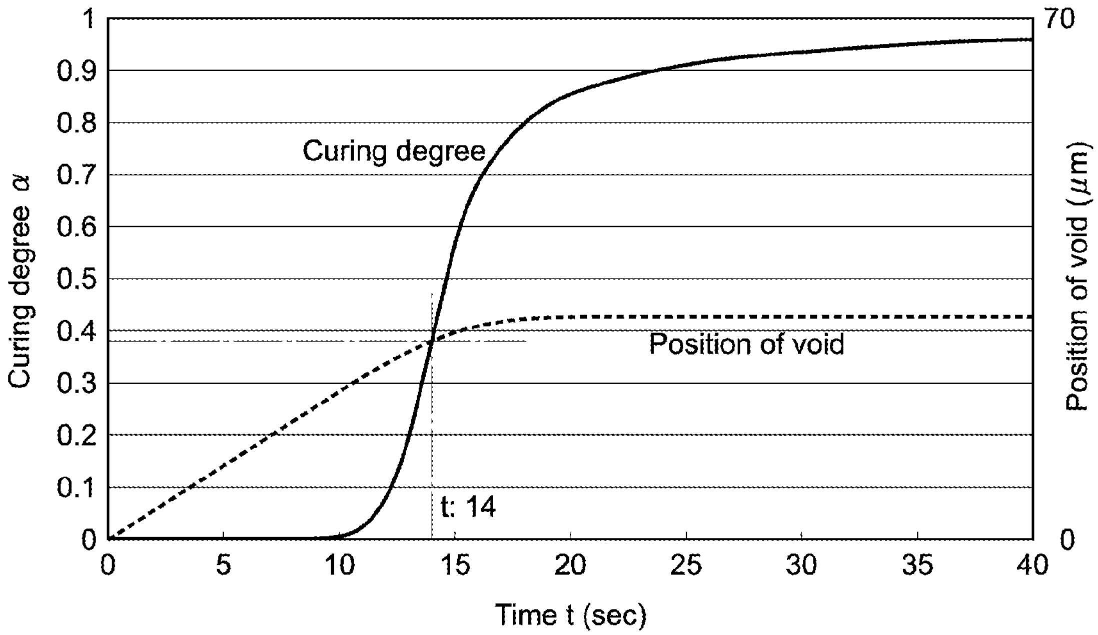
FIG. 8 is a graph representing a curing degree $\alpha$ and a void's ascending position with respect to heating time, based on the result of calculation obtained by the steps 201 to 203.

$P_v$: vapor pressure inside the void $P_L$: liquid pressure around the void to be exerted on the void σ: surface tension of resin FIG. 8 is a graph representing a curing degree α and a void's ascending position [μm] with respect to heating time, based on the result of calculation obtained by the steps 201 to 203. That is to say, this means a theoretical value based on calculation. A curve showing the curing degree α, that is, the curing degree curve, shows one in FIG. 5 in which the resin temperature is 200° C.

(d) Determination of Heating Conditions of Thermosetting Resin (Step 204)

Theoretically, it can be found from the graph of FIG. 8 that the upward movement of the void stops when the curing degree α is for example 0.3 to 0.6 (around 0.4, in this case), and a length of time until this time from starting heating is about 14 seconds. In other words, it indicates that the void escapes out of the resin at the timing when this length of time elapses from starting heating. This length of time will be a theoretical value of the void removal time. Typically, this void removal time may be defined to be a time at the intersection of the curing degree curve and the curve indicating the void's ascending position.

The point is that by determining a time based on the calculated void removal time as a heating time, it becomes possible to stop heating at a predetermined temperature (e.g., resin temperature of 200° C., in this case) at the timing when the void escapes; or it becomes possible to go on to low-temperature heating processing at the timing when the void escapes, the low-temperature heating processing being described in a second embodiment which will be described later. By thus making it possible to stop heating at the timing when the void escapes, it would be possible to enhance the time efficiency of the heating processing, and make the productivity increased.

The time based on the void removal time may be the void removal time itself, or may be a time determined by taking into account a certain range (e.g., margin of error, etc.) with respect to the void removal time. Such a range from this baseline may be determined within a range of, for example, plus or minus 5 seconds.

Note that the viscosity of epoxy resin in which an occurrence of the residual void (or referred to as "void trap") would be prevented is about 500 μPa·s.

(3) Comparison Between Theoretical and Experimental Values

Figure 9:
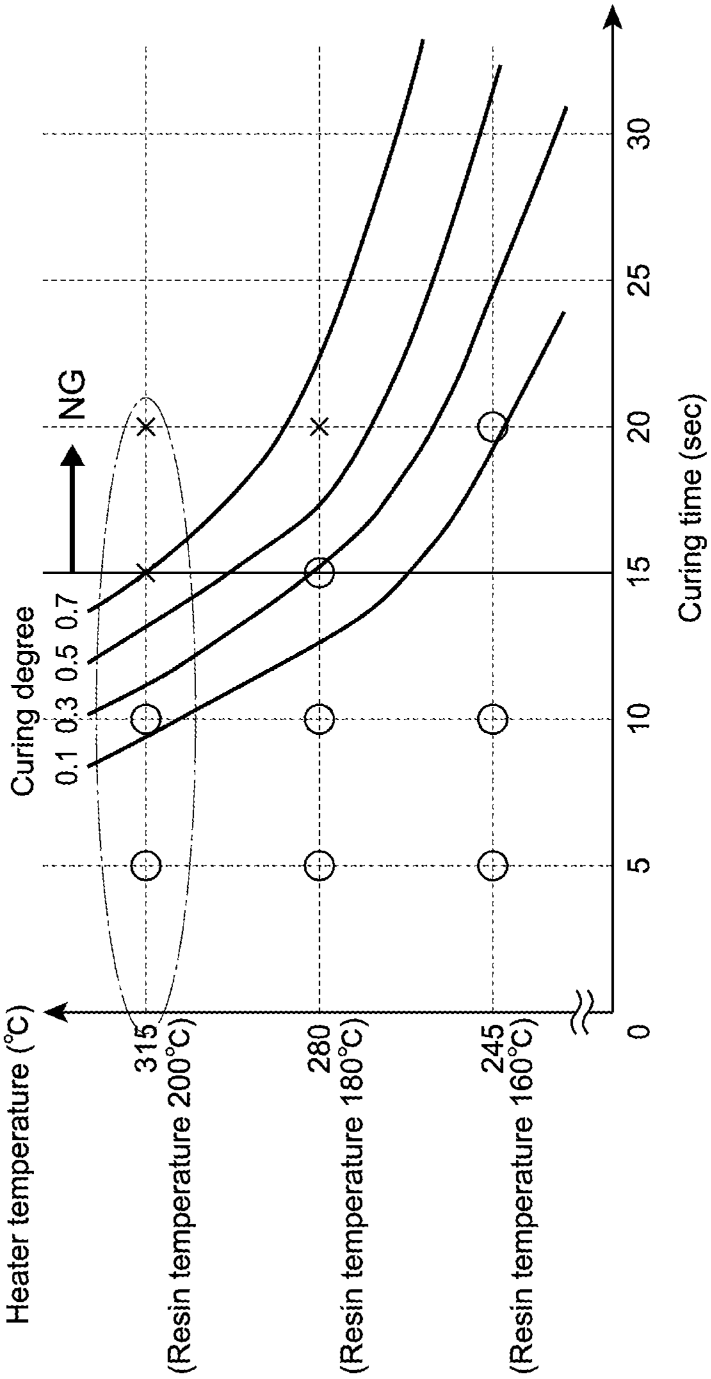
FIG. 9 shows a result of an experiment that the present inventor checked the remaining voids by breaking the actual thermally cured resin after the thermal compression bonding process of FIG. 2.

FIG. 9 shows a result of an experiment that the present inventor checked the remaining voids by breaking the actual thermally cured resin after the thermal compression bonding process (Step 104). The purpose of this experiment is to compare a theoretical value of the void removal time and an experimental value thereof.

In FIG. 9, the mark "○" indicates that the residual void did not occur and the mark "x" indicates that the residual void occurred. The ordinate in the graph of FIG. 9 corresponds to the above-mentioned three resin temperatures of 200° C., 180° C. and 160° C. The curves in this graph are those obtained by measuring the time that it took to reach each cure degree of 0.1, 0.3, 0.5 and 0.7, with respect to each of the three cure degree curves (see FIG. 5), and by connecting the equal cure degree points.

As can be seen from FIG. 9, when the resin temperature is 200° C., a boundary between the states with and without the occurrence of the residual void is at the cure degree of around 0.5. In other words, this experimental value of the void removal time almost matches the theoretical value that has been obtained in FIG. 8.

Regarding the case of the epoxy resin, a preferred range of the heating temperature in this embodiment may be 200° C. or higher and 250° C. or lower. In this case, a range of the heating time may be set to 10 seconds or more and 20 seconds or less. Note that in cases where the heating is performed at 200° C. or higher and 250° C. or lower, a solder material to be selected would be one having the solder melting temperature in the same temperature range.

(4) Summary

As described above, according to this embodiment, the void removal time obtained based on the cure degree curve with respect to the predetermined heating temperature (resin temperature) is calculated. Then the resin is heated at the heating temperature that corresponds to the cure degree curve (first heating temperature), from the start of the heating processing until the void removal time. By thus reducing the residual voids, it may make it possible to produce circuit devices having a high-quality sealing material, which can improve the reliability of the products.

In this embodiment, instead of using the commonly-used Kamal's equation, the modified Kamal's equation, obtained by incorporating the resin coefficient obtained based on DSC data, is used. Therefore, even in cases where a thermosetting resin that contains a plurality of curing agents and activators is employed, it would be possible to obtain a theoretical curing degree curve based on this modified Kamal's equation so that the theoretical curing degree curve is as close to the actual curing degree curve as possible.

Incidentally, in Japanese Patent Application Laid-open No. 2012-81703, a technique of changing the conditions for a heat curing process of a resin on the basis of analysis of the void's generation, growth, flow behavior, and so on, has been described. However, this existing technique is about analyzing a "behavior of the void inside the compressed resin" when the resin is filled in a mold for resin molding. This technique may not be applicable at all to the present disclosure which intends to analyze a state of natural upward movement of a void in a bear-state resin between an electronic component and a mounting substrate.

Consequently, with the technique in the past, it has been difficult to predict the occurrence of residual voids in the bear-state resin as in the present disclosure; and there has been a need of grasping it by destructive inspection by repetition of experiments or by nondestructive testing with the use of X-ray. In particular, as shown in FIG. 1F, the presence or absence of the residual voids has not been able to be determined except at the time of inspection of the resin after curing, so there has been a need of breaking and checking the resin at this time. If a product should be determined as a defective product by this inspection, the process should then go back to and start over from providing the resin (see FIG. 1C), which makes a loss of time, components and materials. Further, in order to avoid such a loss, there has been a need of conducting some experiments repetitively at the experimental stage.

In contrast to this, the present disclosure can make it possible to avoid such a loss of time, components and materials. Further, it may also make it possible to improve the efficiency of experiments to create the conditions for the heat curing of the resin.

2. Second Embodiment

A method of producing a circuit device according to a second embodiment includes the above-described production process of circuit devices of the first embodiment. On that basis, this production method includes a process after the heat processing by the heating temperature of the curing degree curve that is used (first heating temperature); the process being a process of further heating the resin at a temperature that is lower than the first heating temperature (second heating temperature).

Specifically, in cases where the thermosetting resin is an epoxy resin, a range of the second heating temperature may be 100° C. or higher and 150° C. or lower. In this case, a range of the heating time may be set to 600 seconds or more and 1000 seconds or less. More desirably, the range of the heating time may be 700 seconds or more and 900 seconds or less.

By thus heating the resin at the second heating temperature slowly over time, after the void removal time has elapsed, under a state where the void has almost gone due to the heating at the first heating temperature; it makes it possible to enhance the quality of the thermosetting resin.

3. Third Embodiment

A method of producing a circuit device according to a third embodiment includes the above-described production process of circuit devices of the first embodiment. On that basis, in this production method of the third embodiment, the electronic component 31 is connected to the substrate by a method shown in FIGS. 10A to 10C.

Figure 10:
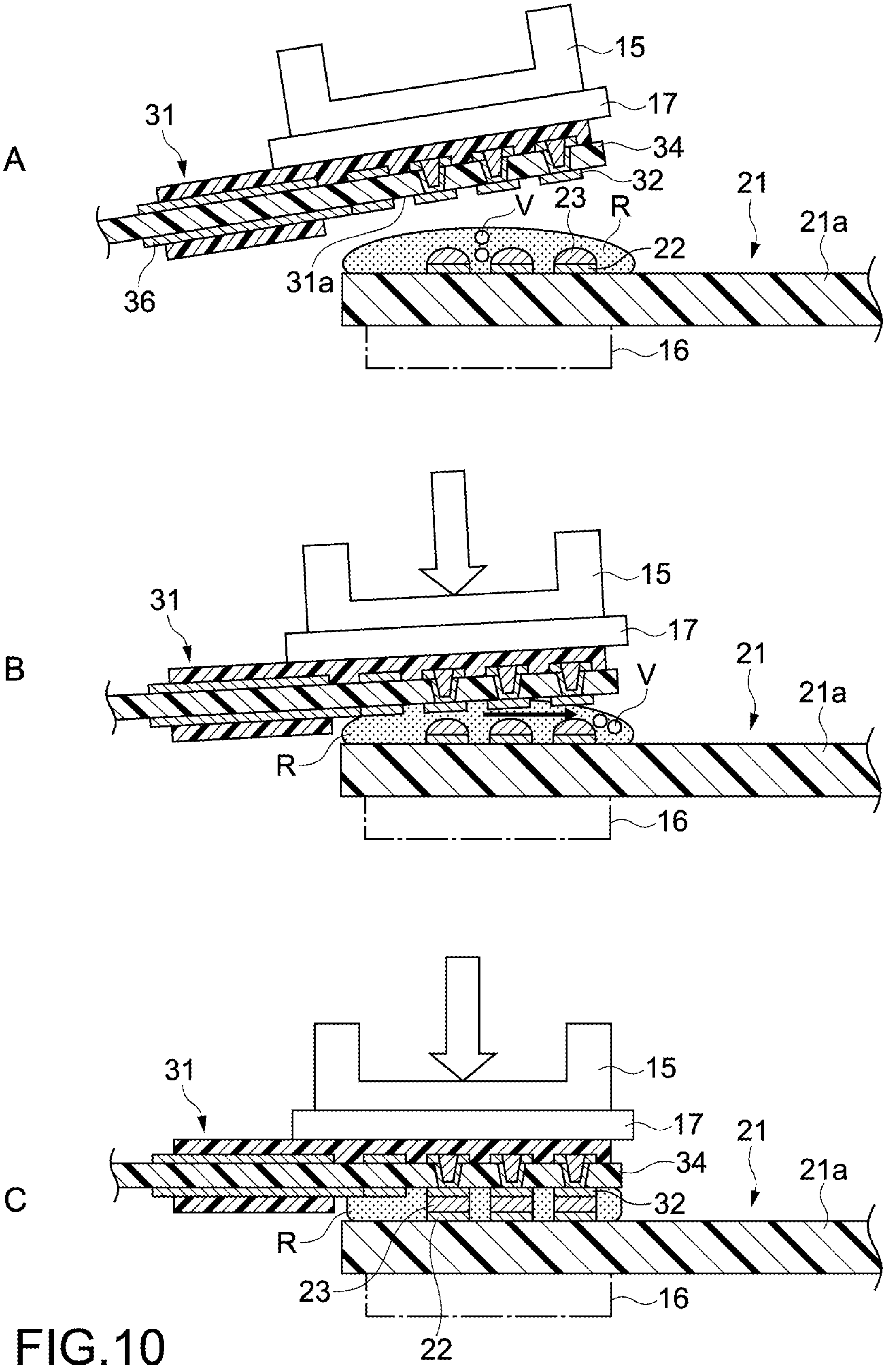
FIGS. 10A to 10C show a production process according to a third embodiment in order.

Note that the electronic component 31 shown in FIGS. 10A to 10C is a flexible print circuit (FPC), but of course the electronic component 31 may be an integrated circuit as has been described in the first embodiment.

The FPC 31 has a base layer 34 made of a material such as polyimide, a metal wiring 36, a plurality of electrodes 32, and the like. As shown in FIG. 10A, the thermosetting resin R is provided above the electrode 22 on the mounting substrate 21 and on the solder part 23 on the electrode. In a state where an electrode arrangement surface 31*a* on which the electrodes 32 of the FPC 31 are disposed is angled with respect to a mounting surface 21*a* on which the electrodes 22 of the substrate 21 is disposed, or in other words, in an inclined state, the FPC 31 is brought into contact with the thermosetting resin R on the mounting substrate 21.

Then, as shown in FIG. 10B, while heating the thermosetting resin R by a heater built in the press-head 15, the FPC 31 is pressed against the thermosetting resin R in such a manner that the angle between the electrode arrangement surface 31*a* and the mounting surface 21*a* is lowered. Thus, as shown in FIG. 10C, the solder part 23 is melted, and the electrodes 22 and 32 are connected to each other. Note that the press-head 15 presses the FPC 31 via a Teflon sheet 17.

By the mounting method of this embodiment, voids V move in a direction containing a horizontal component (along the mounting surface 21*a* of the mounting substrate 21), and are made to be pushed out of the thermosetting resin R. Thus, the voids can be readily removed, so it becomes possible to reduce the residual voids. It makes it possible to reduce the number of residual voids inside the resin in the mounting surface area to be lower than the number of residual voids inside the resin outside the mounting area.

Note that the heating processing at the first temperature being described in the first embodiment starts at the timing when the FPC 31 touches the resin R as in FIG. 10B.

As shown in the figure, there are some cases where a heater 16 is disposed at a lower surface of the mounting substrate 21.

Although there are no solder parts on the electrodes 32 on the FPC 31 in this embodiment, it is also possible to provide the electrodes 32 with solder parts.

4. Other Embodiments

The present disclosure is not limited to the above-described embodiments, and other various embodiments may be made.

The method of producing a circuit device, according to the present disclosure, may further include irradiating the thermosetting resin with ultrasonic waves during heating the thermosetting resin (or after heating it). Or, the method may further include subjecting the thermosetting resin to an alternating magnetic field during or after heating the thermosetting resin. This may allow the void to escape into the air in cases where the void has risen to the surface of the thermosetting resin. This may enable to ensure removal of the void.

In the above description, the present disclosure has been applied to flip-chip mounting; but this can be applied to other known mounting methods such as wire bonding.

The above-described embodiments have been described regarding a case with an epoxy resin as the thermosetting resin. However, the DSC measurement, DSC integration, modified Kamal's equation, Arrhenius equation, and the like, are applicable to common technologies for resins in general. Therefore, the present disclosure may also be applied to other thermosetting resins such as phenol resins and melamine resins.

Electronic apparatuses that are provided with circuit devices in which the present disclosure has been applied may include: a personal computer; a smartphone; a tablet-type computer; and other various known electronic apparatuses.

Out of the characteristic parts of the embodiments described above, at least two characteristic parts, such as the features of the second and third embodiments, can be combined.

The present disclosure may employ the following configurations.

(1) A method of determining curing conditions of a thermosetting resin to seal a conductive part between a substrate and an electronic component, the method including:

creating a curing degree curve which indicates, with respect to each of heating temperatures, relationship between heating time and curing degree of the thermosetting resin;

calculating, on the basis of the created curing degree curve, a void removal time of a void naturally moving upward in the thermosetting resin at a first heating temperature which is one of the heating temperatures; and determining a time based on the calculated void removal time, as a heating time at the first heating temperature.

(2) The method of determining curing conditions according to (1), in which the calculating includes converting the created curing degree curve to viscosity of the thermosetting resin, and calculating the void removal time based on an equation representing a state of the natural upward movement of the void, using as a parameter the viscosity obtained from the conversion.

(3) The method of determining curing conditions according (2), in which the equation representing the state of the natural upward movement of the void further uses as a parameter a diameter of the void, and the calculation of the void removal time includes calculating the void removal time based on an equation representing relationship between the diameter of the void and a pressure being applied to the void.

(4) A method of producing a circuit device, the method including:

calculating, on the basis of a curing degree curve, a void removal time of a void naturally moving upward in a thermosetting resin at a first heating temperature which is one of heating temperatures, in which the curing degree curve indicates, with respect to each of the heating temperatures, relationship between heating time and curing degree of the thermosetting resin;

providing the thermosetting resin onto a substrate so as to cover a solder part provided on an electrode on the substrate;

placing an electronic component on the substrate in such a manner that an electrode of the electronic component or a solder part provided on this electrode confronts the solder part provided on the electrode on the substrate being provided with the thermosetting resin; and heating the thermosetting resin at the first temperature, until the void removal time that has been obtained by the calculation elapses from starting heating.

(5) The method of producing a circuit device according to (4), in which the heating of the thermosetting resin includes heating the thermosetting resin from both a side of the electronic component and a side of the mounting substrate.

(6) The method of producing a circuit device according to (4), in which the thermosetting resin is an epoxy resin.

(7) The method of producing a circuit device according to any one of (4) to (6), in which the first heating temperature is 200° C. or higher and 250° C. or lower.

(8) The method of producing a circuit device according to any one of (4) to (7), the method further including heating the thermosetting resin at a second heating temperature after the time based on the void removal time has elapsed from starting heating, the second heating temperature being lower than the first heating temperature.

(9) The method of producing a circuit device according to (8), in which the second heating temperature is 100° C. or higher and 150° C. or lower.

(10) The method of producing a circuit device according to any one of (4) to (9), in which the calculating includes converting the created curing degree curve to viscosity of the thermosetting resin, and calculating the void removal time based on an ascent rate or a position by the natural upward movement of the void, using as a parameter the viscosity obtained from the conversion.

(11) The method of producing a circuit device according to any one of (4) to (10), in which the placing of the electronic component on the substrate includes bringing the electronic component into contact with the thermosetting resin on the substrate in a state where: an electrode arrangement surface of the electronic component on which the electrode is disposed, or a solder arrangement surface on which the solder part provided on the electrode is disposed, is angled with respect to a mounting surface of the substrate on which the electrode of the substrate is disposed; and pressing the electronic component against the thermosetting resin, after the contact, in such a manner that the angle between the mounting surface of the substrate and the electrode arrangement surface or the solder arrangement surface of the electronic component is lowered.

(12) A method of producing a circuit device, the method including:

calculating, on the basis of a curing degree curve, a void removal time of a void naturally moving upward in a thermosetting resin at a first heating temperature which is one of heating temperatures, in which the curing degree curve indicates, with respect to each of the heating temperatures, relationship between heating time and curing degree of the thermosetting resin;

providing the thermosetting resin onto a substrate so as to cover an electrode on the substrate;

placing an electronic component on the substrate in such a manner that a solder part provided on an electrode of the electronic component confronts the electrode on the substrate being provided with the thermosetting resin; and heating the thermosetting resin at the first temperature, until the void removal time that has been obtained by the calculation elapses from starting heating.

(13) A circuit device, which is obtained by a production method including:

calculating, on the basis of a curing degree curve, a void removal time of a void naturally moving upward in a thermosetting resin at a first heating temperature which is one of heating temperatures, in which the curing degree curve indicates, with respect to each of the heating temperatures, relationship between heating time and curing degree of the thermosetting resin;

providing the thermosetting resin onto a substrate so as to cover a solder part provided on an electrode on the substrate;

placing an electronic component on the substrate in such a manner that an electrode of the electronic component or a solder part provided on this electrode confronts the solder part provided on the electrode on the substrate being provided with the thermosetting resin; and heating the thermosetting resin at the first temperature, until the void removal time that has been obtained by the calculation elapses from starting heating.

(14) A circuit device, which is obtained by a production method including:

calculating, on the basis of a curing degree curve, a void removal time of a void naturally moving upward in a thermosetting resin at a first heating temperature which is one of heating temperatures, in which the curing degree curve indicates, with respect to each of the heating temperatures, relationship between heating time and curing degree of the thermosetting resin;

providing the thermosetting resin onto a substrate so as to cover an electrode on the substrate;

placing an electronic component on the substrate in such a manner that a solder part provided on an electrode of the electronic component confronts the electrode on the substrate being provided with the thermosetting resin; and heating the thermosetting resin at the first temperature, until the void removal time that has been obtained by the calculation elapses from starting heating.

DESCRIPTION OF REFERENCE SYMBOLS

11, 31 electronic component
12, 22, 32 electrode
13, 23 solder part
21 mounting substrate
21*a* mounting surface
31 FPC (electronic component)
31*a* electrode arrangement surface

The invention claimed is:

1. A method of determining curing conditions of a thermosetting resin to seal a conductive part between a substrate and an electronic component, the method comprising:

creating a curing degree curve which indicates, with respect to each of heating temperatures, relationship between heating time and curing degree of the thermosetting resin;

calculating, on the basis of the created curing degree curve, a void removal time of a void naturally moving upward in the thermosetting resin at a first heating temperature which is one of the heating temperatures; and determining a time based on the calculated void removal time, as a heating time at the first heating temperature, wherein, the calculating includes (a) converting the created curing degree curve to viscosity of the thermosetting resin, and (b) calculating the void removal time based on an equation representing a state of the natural upward movement of the void, using as a parameter the viscosity obtained from the conversion, the equation representing the state of the natural upward movement of the void further uses as a parameter a diameter of the void, and the calculation of the void removal time includes calculating the void removal time based on an equation representing relationship between the diameter of the void and a pressure being applied to the void.

2. A method of producing a circuit device, the method comprising:

calculating, on the basis of a curing degree curve, a void removal time of a void naturally moving upward in a thermosetting resin at a first heating temperature which is one of plural heating temperatures, in which the curing degree curve indicates, with respect to each of the heating temperatures, relationship between heating time and curing degree of the thermosetting resin;

providing the thermosetting resin onto a substrate so as to cover a solder part provided on an electrode on the substrate;

placing an electronic component on the substrate in such a manner that an electrode of the electronic component or a solder part provided on this electrode confronts the solder part provided on the electrode on the substrate being provided with the thermosetting resin;

heating the thermosetting resin at the first heating temperature, until a time based on the void removal time obtained by the calculation elapses from starting heating; and heating the thermosetting resin at a second heating temperature after the time based on the void removal time has elapsed from starting heating, the second heating temperature being lower than the first heating temperature.

3. The method of producing a circuit device according to claim 2, wherein the heating of the thermosetting resin includes heating the thermosetting resin from both a side of the electronic component and a side of the mounting substrate.

4. The method of producing a circuit device according to claim 2, wherein the thermosetting resin is an epoxy resin.

5. The method of producing a circuit device according to claim 2, wherein the first heating temperature is 200° C. or higher and 250° C. or lower.

6. The method of producing a circuit device according to claim 2, wherein the second heating temperature is 100° C. or higher and 150° C. or lower.

7. The method of producing a circuit device according to claim 2, wherein the calculating includes (a) converting the created curing degree curve to viscosity of the thermosetting resin, and (b) calculating the void removal time based on an equation representing an ascent rate or a position by the natural upward movement of the void, using as a parameter the viscosity obtained from the conversion.

8. The method of producing a circuit device according to claim 2, wherein the placing of the electronic component on the substrate includes:

bringing the electronic component into contact with the thermosetting resin on the substrate in a state where: an electrode arrangement surface of the electronic component on which the electrode is disposed, or a solder arrangement surface on which the solder part provided on the electrode is disposed, is angled with respect to a mounting surface of the substrate on which the electrode of the substrate is disposed; and pressing the electronic component against the thermosetting resin, after the contact, in such a manner that the angle between the mounting surface of the substrate and the electrode arrangement surface or the solder arrangement surface of the electronic component is lowered.

9. A method of curing a thermosetting resin comprising: calculating curing conditions for the thermosetting resin by (I) creating a curing degree curve which indicates, with respect to each of heating temperatures, relationship between heating time and curing degree of the thermosetting resin; (II) calculating, on the basis of the created curing degree curve, a void removal time of a void naturally moving upward in the thermosetting resin at a first heating temperature which is one of the heating temperatures; and (III) determining a time based on the calculated void removal time, as a heating time at the first heating temperature; and curing the thermosetting resin using the calculated curing conditions, wherein, the calculating includes (a) converting the created curing degree curve to viscosity of the thermosetting resin, and (b) calculating the void removal time based on an equation representing a state of the natural upward movement of the void, using as a parameter the viscosity obtained from the conversion, the equation representing the state of the natural upward movement of the void further uses as a parameter a diameter of the void, and the calculation of the void removal time includes calculating the void removal time based on an equation representing relationship between the diameter of the void and a pressure being applied to the void.

* * * * *